(12) United States Patent
Miller et al.

(10) Patent No.: US 7,009,688 B2
(45) Date of Patent: Mar. 7, 2006

(54) PRINTING BY ACTIVE TILING

(75) Inventors: Richard Jonathan Miller, Malvern Worcestershire (GB); Mark Anthony Gleeson Smith, Malvern Worcestershire (GB)

(73) Assignee: Qinetiq Limited, (GB)

( * ) Notice: Subject to any disclaimer, the term of this patent is extended or adjusted under 35 U.S.C. 154(b) by 90 days.

(21) Appl. No.: 10/450,554

(22) PCT Filed: Dec. 11, 2001

(86) PCT No.: PCT/GB01/05438

§ 371 (c)(1),
(2), (4) Date: Jun. 13, 2003

(87) PCT Pub. No.: WO02/48797

PCT Pub. Date: Jun. 20, 2002

(65) Prior Publication Data

US 2004/0046951 A1    Mar. 11, 2004

(30) Foreign Application Priority Data

Dec. 14, 2000 (GB) .................................. 0030444

(51) Int. Cl.
*G03B 27/72* (2006.01)
*G03B 27/70* (2006.01)

(52) U.S. Cl. .......................................... 355/71; 355/65
(58) Field of Classification Search ................ 355/71, 355/53, 40, 55, 67, 65, 32, 51, 77
See application file for complete search history.

(56) References Cited

U.S. PATENT DOCUMENTS

| 4,668,080 A | 5/1987 | Gale et al. |
| 4,769,680 A | 9/1988 | Resor et al. |
| 5,331,338 A | 7/1994 | Mager |
| 5,691,541 A | 11/1997 | Ceglio et al. |

(Continued)

FOREIGN PATENT DOCUMENTS

EP    0 253 129    1/1988

(Continued)

OTHER PUBLICATIONS

Rudge, et al. "Fly's-Eye Lens Technique for Generating Semiconductor Device Fabrication Masks", IBM Journal, Apr. 1963, pp. 146-150.
International Search Report for PCT/GB01/05438.

*Primary Examiner*—Peter B. Kim
(74) *Attorney, Agent, or Firm*—McDonnell Boehnen Hulbert & Berghoff LLP

(57) ABSTRACT

A photosensitive area 11, such as a photolithographic sheet, in an images plane is notionally subdivided in both dimensions to form contiguous (tiled) sub-areas. Variable illumination means 1,4 provides a selected pixellated light pattern, which is directed 8, 9, 10 to fill a selected one of the sub-areas so that pixels of said pattern are, at least 15 microns across at the sub-area, and control means are responsive to an input signal representative of an image conjointly to control the production and direction of the pixellated patterns so that an entire image is produced over all of the said sub-areas. As shown, the variable illumination means comprises a light source 2 with digital micro-mirror array deflector device 4, and the sub-area is selected by lens array 8 with a shutter 10 and polariser array 11. The latter may be replaced by a two-axis steering mirror and lens array. An analogue micro-mirror array, optionally with, a kaleidoscope, may be used in the illumination means, with (a) collimating optics and lens array; or (b) a focussing macrolens, for sub-area selection.

31 Claims, 2 Drawing Sheets

U.S. PATENT DOCUMENTS

| | | |
|---|---|---|
| 6,211,948 B1 | 4/2001 | Lullau et al. |
| 6,411,366 B1 | 6/2002 | Luellau et al. |
| 2001/0038268 A1 | 11/2001 | Fuchsberger et al. |
| 2002/0012110 A1 | 1/2002 | Luellau |

FOREIGN PATENT DOCUMENTS

| | | |
|---|---|---|
| EP | 0 845 710 | 6/1998 |
| EP | 0 933 925 | 8/1999 |
| GB | 2 284 684 | 6/1995 |
| GB | 2 330 471 | 4/1999 |

PRINTING BY ACTIVE TILING

The present invention relates to the use of active tiling in two dimensions for exposing a photosensitive surface to an optical pattern or image. It has particular but not exclusive relevance to the preparation of printing plates, especially those of relatively large dimensions where it is desired to maintain a good resolution.

While it is possible to take a displayed image, e.g. from a liquid crystal matrix, and transfer it to a photoresist to create a mask or printing plate, there are size versus resolution limitations. For example, a plate of say 10 by 20 inches at a resolution of 600 dpi would require 6000 by 12000 pixels. It is currently not practical, and maybe not possible, to produce a passive matrix addressed liquid crystal spatial light modulator having these numbers of edge contacts. Furthermore, 600 dpi equates to a pixel size of 40 microns, and this again is not possible for current active matrix liquid crystal displays.

The invention uses an active tiling technique for the piecemeal selective exposure of a photosensitive surface, whereby it is possible to use a device with relatively low numbers of pixels to synthesise an image having a much larger number of pixels. In this way a large image can be recorded on the photosensitive surface with good resolution.

The use of active tiling in the preparation of holographic images is known. In such a system, sub-images are tiled onto the surface of an optically addressed spatial light modulator (OASLM), e.g. a bistable electro-optic liquid crystal device incorporating a photoconductive layer, and the resulting image is illuminated with coherent light, normally in the visible range so that the resultant image can be directly viewed. An example is disclosed on UK Patent Application No 2330471 (Secretary of State for Defence).

This type of holographic image preparation system only works when the pixels are suitably small, preferably of the order of the wavelength of the coherent radiation, but in present practice somewhat larger at around 6 microns, which size nevertheless remains very difficult to obtain. It should be noted that the above-mentioned patent application refers to the use of demagnifying optics to decrease the effective pitch of each pixel in the spatial light modulator(s), i.e. as incident on the OASLM. In addition, in this type of application a very large number of pixels is required (say around $10^{10}$) for a workable system, and in one approach a 3-inch diagonal OASLM supports 25 (5 by 5) tiled images ($25 \times 10^6$) pixels forming one channel, there being a collection of such channels which provide a section (only) of the complete hologram.

Technical requirements for a mask printing system are different. Shorter wavelength UV light is commonly used, with a different type of photosensitive material such as a photoresist/photocurable material, or conversely a, material which becomes removable, e.g. soluble, when optically exposed. The resolution necessary for printing is much lower than for holographic systems, and so less demanding. As noted above, 40 microns equates approximately to 600 dpi, and would be a common requirement, although 20 microns or even 15 microns could be preferred in some applications.

Additionally it is known to use a liquid crystal matrix for selectively exposing photosensitive material in applications involving the printing of typed material see for example U.S. Pat. No. 4,830,468 (Xerox) and U.S. Pat. No. 4,783,146 (Xerox) in which a linear array of liquid crystal shutters is used to print an image one line at a time; and U.S. Pat. No. 3,824,604 (Stein) and U.S. Pat. No. 4,429,369 (Stanly) which employ a liquid crystal matrix to form alphanumeric characters for transmission to a xerographic machine or photographic material. In this type of apparatus, the array either extends over the whole of one of the dimensions of the photosensitive surface (or that area thereof to be used), or the size of the basic alphanumeric image is very small and is moved relative to the receiving surface in some way. Text formed from alphanumeric characters differs from other types of image in that a space is naturally provided between each pair of characters so that tiling need not be as precise as in images where there is a degree of correlation of image content between tiles.

In a first aspect, the invention provides apparatus for exposing a photosensitive area in a predetermined image plane which is notionally subdivided in both dimensions to form contiguous sub-regions, the apparatus comprising variable illumination means for producing a selected pixellated light pattern, directing means for directing said pattern to fill a selected one of said sub-regions, and control means responsive to an input signal representative of an image conjointly to control said illumination means and said directing means such that the entire image is produced over all of the sub-regions in said plane. For production of a printing plate, for example, the pixels need be no smaller than 15 microns at the image plane, preferably no smaller than 20 microns. While they can be significantly larger, e.g. 100 microns, according to desired result, it is preferred that they are no larger than 40 microns.

The illumination means may be a light source (for example an array of light emitting diodes, VCSELs—vertical cavity surface emitting lasers, or an electroluminescent array) or a light modulator receiving illumination from a separate source. Typical such, light modulators are liquid crystal arrays and micro-electromechanical (MEM) devices, such as an array of very small movable mirrors. The amount of contrast available will be determined at least in part by the type of illumination means which is used.

A typical MEM mirror array comprises 1000 by 1000 pixels or 2000 by 2000 pixels, each pixel being provided by a mirror switchable between two states, e.g. plus and minus 10° relative to the plane of the array. These devices would require 12 by 12, or 6 by 6 replications (sub-regions) for a 20 by 20 inch photosensitive area. Also known are MEM mirror arrays in which the angular deflection of each mirror may take a selected one of three or more values, e.g. seven as particularly described later. In the simplest from of construction, deflection of each mirror element is about a single axis; but arrangements where each element is deflectable about two axes have been proposed.

In certain instances, for example where it is desired to expose a photosensitive surface to ultra-violet (UV) or near UV light (blue end of the spectrum), the wavelength limitation may prevent the use of certain optical elements (for example liquid crystals tend to degrade with excessive UV illumination, or are incapable of providing the required modulation), and may limit the choice of illumination means. In such a case, or where a broad optical range of illumination wavelength may need to be employed for different purposes, the use of an MEM device may be preferred by virtue of its relative insensitivity to wavelength. It is also relatively insensitive to high radiation intensities, and does not require polarising optics.

Preferably, the illumination means is electrically addressed, although other pixelwise addressing means may be used which are known per se for the type of illumination means adopted.

Often the illumination means will not contain any facility for directing the light therefrom. In such a case, the directing means will be entirely separate therefrom, and may comprise a variable light deflector or spatial selector for selecting the sub-region to be illuminated, and/or even a means for moving the photosensitive area. In other cases, light direction provided by the illumination means is in one direction only (e.g. an array of micro-mirrors tiltable about a single axis to a selected one of a plurality of angles, and a separate means maybe required for the second direction, e.g. a variable light deflector, spatial selector or moving means as before.

In one type of arrangement light from the illuminating means is spread over a wide angle, for example using a diffuser at an image plane, and multiple images of the illuminating means are formed, for example using a lenticular lens array. A suitable spatial selector for receiving the resulting light comprises collimating optics for receiving light from the illuminating means, followed by replication optics, such as a lenticular lens array each lens of which receives the same pattern of illumination from the collimating means, and a spatial shutter array for selecting the lenticular lens corresponding to the selected sub-region. The spatial shutter could be any known suitable device, but one device preferred for its speed comprises an array of nematic liquid crystal $\pi$ cells.

However, it is often simpler and more efficient to use a light deflector capable of acting in both dimensions. Any suitable light deflector or combination of light deflectors (one per dimension) known in the art may be used for this purpose, but a preferred device is provided by a two-axis steerable mirror, which again has the virtue of being relatively insensitive to wavelength and high radiation intensity. In an embodiment, a light pattern from an illuminating means is directed via focussing optics, such as a lens, onto a two-axis steerable mirror followed by a focussing lenticular lens array. The steerable mirror is controlled to select which lenticular lens is illuminated, corresponding to the selected sub-region.

Either of the above arrangements can be used in conjunction with an MEM mirror array operated digitally, i.e. each single mirror of the array providing a pixel of the pattern) is operated digitally either to direct light toward the predetermined image plane or in another direction.

In other instances, the illuminating means may itself contribute to the determination of the light direction, and so form part of the light directing means. A typical and preferred example thereof is an MEM mirror array operated in an analogue manner. For the provision of a pattern for a selected sub-region, the array is operated in a quasi-digital manner as above. However, the all mirrors providing the light to be directed towards the image plane are deflected by the same angle, which can be varied according to the location of the selected sub-region. Thus, such a device operated in this manner could be followed by a kaleidoscopic system and a focussing macro-lens, the angle of deflection of the mirrors of the array determining which area of the lens is illuminated for transmission to an adjacent (selected) sub-region. In this arrangement the kaleidoscope provides even illumination of the spatial light modulator and multiple images are available therefrom by internal reflection—which of the multiple images actually contains the light energy depends on the deflection angle provided by the mirrors. Alternatively, light from an analogue operated MEM mirror array could be passed by collimating optics such as a macro-lens, a selected region of which is illuminated as before, to a selected one of lenticular lens array corresponding to the selected sub-region. Unlike the two arrangements discussed in the previous three paragraphs, both of these arrangements require light which is relatively well collimated.

In a second aspect, the invention provides a method of exposing a photosensitive area, in response to an input signal representative of an image, said area being notionally sub-divided in both dimensions to form contiguous sub-regions, comprising the steps of providing a light pattern corresponding to a selected part of said image and directing said pattern to fill a corresponding selected one of said sub-regions and repeating the process for other sub-regions until the entire image is produced over all of the sub-regions of said area.

Further details and advantages of the invention will become evident on a reading of the appended claims, to which the reader is directed, and upon a consideration of the following description of embodiments of the invention, made with reference to the accompanying drawings, in which:

In the Figures the same reference number is used in respect of corresponding elements performing similar functions.

Figure 1:
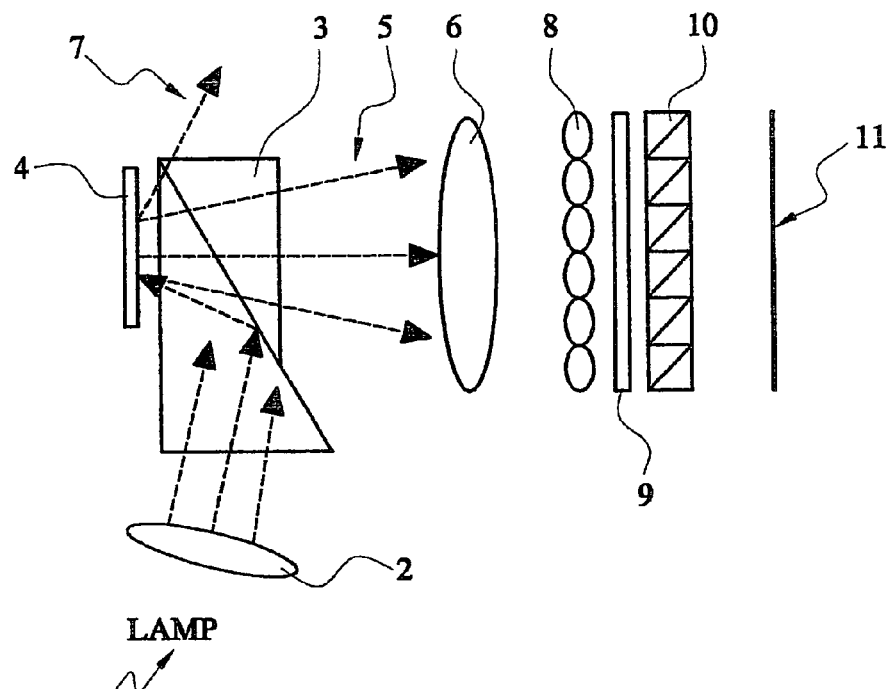
FIG. 1 shows a first embodiment of the invention using a digitally operated MEM mirror array in conjunction with a spatial shutter array.

In FIG. 1 light from a lamp or laser source 1 is directed via a lens 2 and a bean splitter 3 onto a micro-electromechanical array 4 of 1000 by 1000 mirrors each of which can be deflected between two angles. Light 7 reflected from mirrors at one of the angles is lost from the system, but diverging light 5 reflected from mirrors at the other angle and transmitted through the splitter 3 is collimated by a lens 6 and is then incident on a 12 by 12 lens array 8. Each lenticular lens forms a separate image of the array 4.

One such image is selected by a corresponding 12 by 12 array of shutters formed by a liquid crystal array 10 of $\pi$ cells and a 12 by 12 array of (Glan-Taylor polarisers 10 (a single large polariser could be used). Light incident on the liquid crystal array should be polarised, and this is effected either by a separate polariser, for example immediately following the lamp 1, by using a laser source 1,or by providing a polarising beam splitter 3. In use a selected $\pi$ cell is activated to rotate the plane of incident light by 90° to enable transmission byte corresponding polariser 10 in known manner so that an image of the whole array 4 is formed on a selected sub-area in an image plane 11.

In operation of the system, an input signal representative of an image which is very large in terms of numbers of pixels, for example 12000 by 12000, is effectively broken down to sub-image signals representative of 12 by 12 contiguous (tiled) sub-images. Each sub-image signal in turn is used to address the mirror array 4, while information concerning the location of the sub-image within the entire image is used to control the shutter array so that the sub-image is directed to the correct location in plane 11, so that eventually the entire image is reproduced in plane 11. The sub-images may be provided in any predetermined order, but preferably immediately adjacent sub-images are formed in immediate succession, for example serially along a first line of 12 sub-images, the serially along succeeding lines, either in the same line direction (as in conventional raster scanning) or in reverse directions (as in boustrophedral scanning).

In use, a photosensitive surface is located in plane 11. Where this surface is for production of a printing mask or plate, e.g. a photoresist layer, it may be necessary to use a UV source 1.

In this system it must be ensured that the light 5 is sufficiently diverging for uniform illumination of the lens array 8. With certain types of light source or illumination optics, or where an alternative type of light modulator replaces the mirror array 4, this may occur naturally, but in other cases additional means known per se are provided to ensure that this happens.

Figure 2:
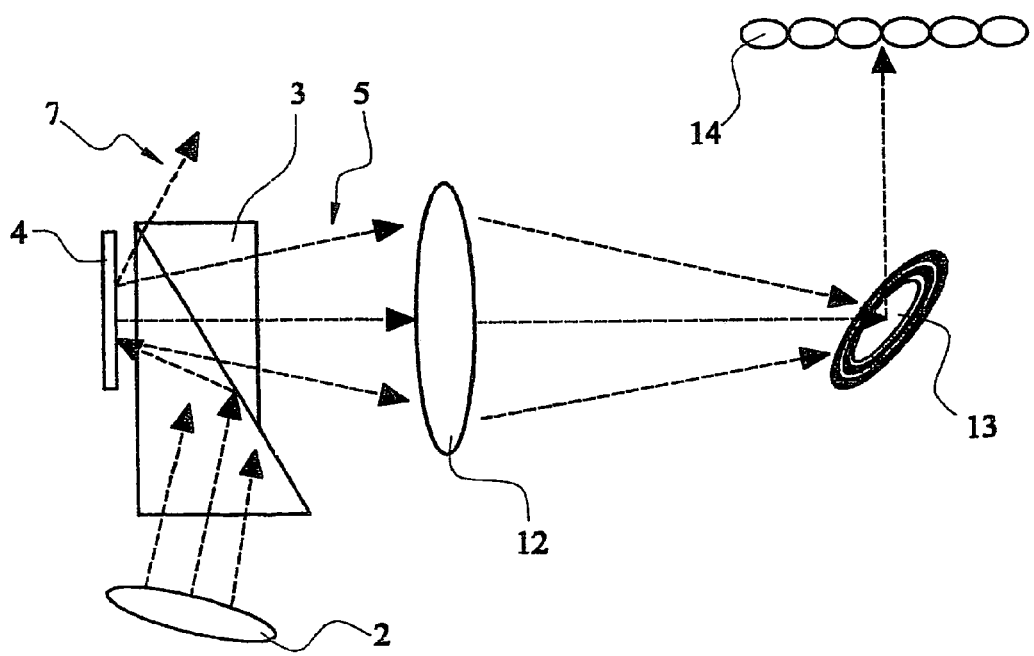
FIG. 2 shows a second embodiment of the invention using a digitally operated MEM mirror array in conjunction with a two-axis steerable mirror.
Figure 3:
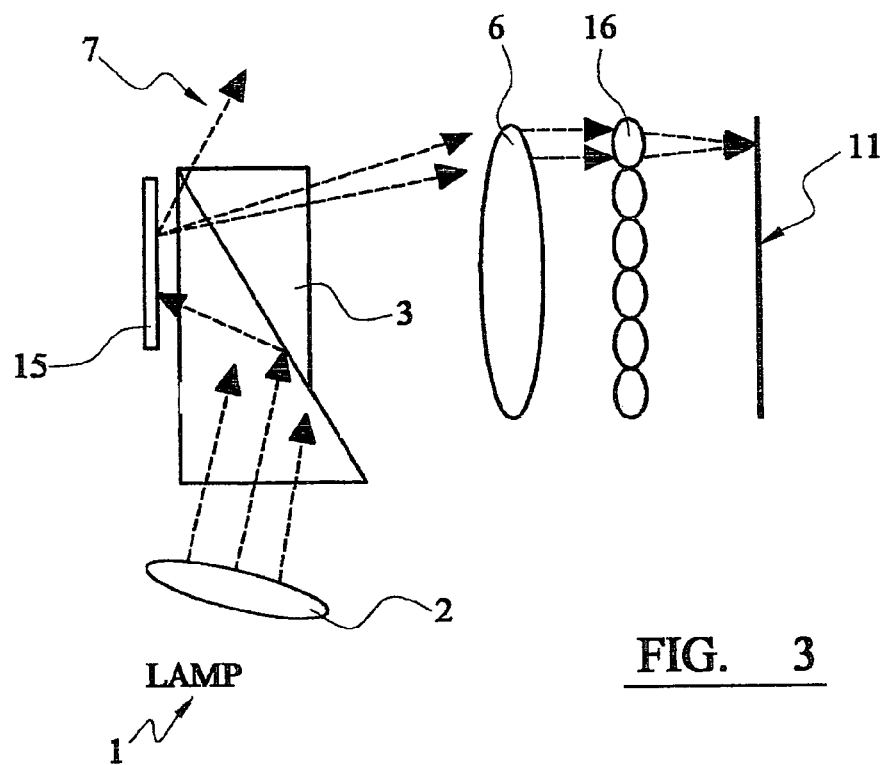
FIG. 3 shows a third embodiment of the invention using an analogue operated MEM mirror array in conjunction with collimating optics and a lenticular lens array.
Figure 4:
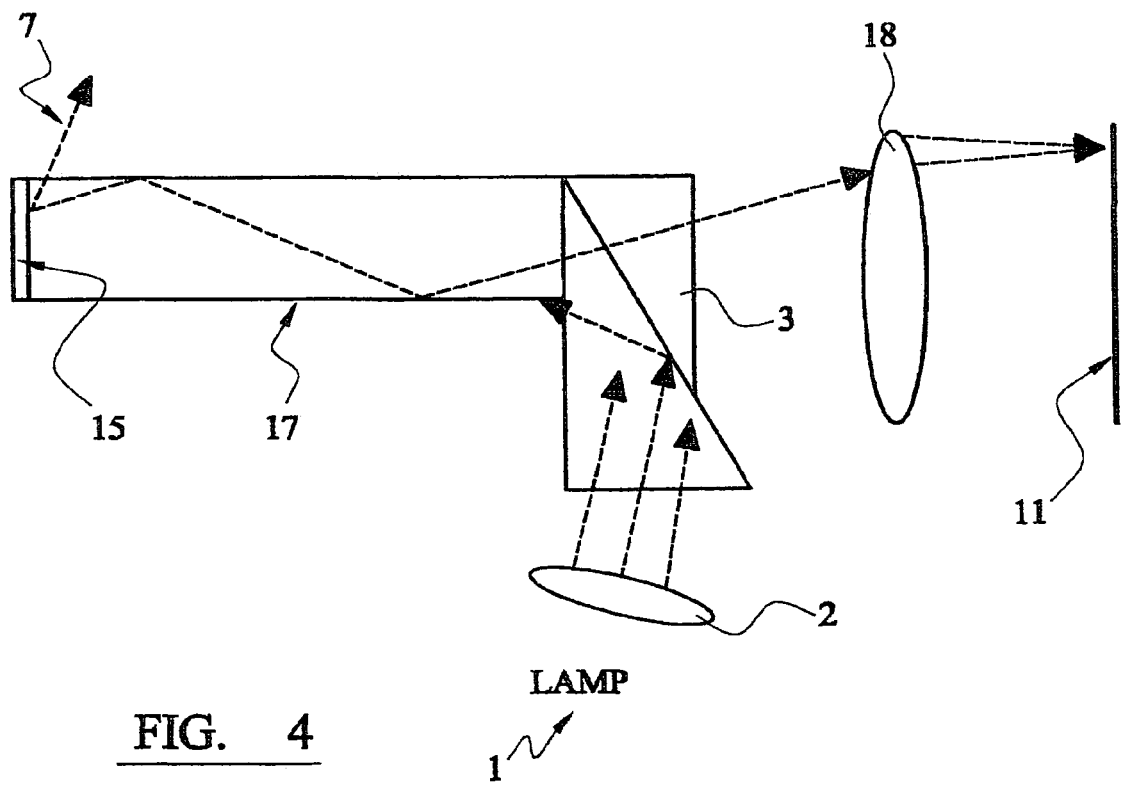
FIG. 4 shows a fourth embodiment of the invention using an analogue operated MEM mirror array in conjunction with a kaleidoscope and focusing optics.

Generally it is preferred to avoid the use of polarisation optics, and FIGS. 2 to 4 have no such requirement. In these Figures the light source may provide polarised (for example laser) or unpolarised light.

In FIG. 2, the diverging light beam 5, is focused by a lens 12 via a mirror 13 and a 12 by 12 lens array 14 onto the imaging plane 11. The mirror 13 is tiltable about two axes so that a selected one of the lenses of array 14 receives substantially all of the sub-image light 5 from the array 4 and produces a corresponding sub-image at its location in plane 11, so that again a complete image may eventually be synthesised thereon by tiling. In this arrangement, the light from source 1 need not be collimated. As shown and preferred, the mirror is planar, but a mirror curved in one or both dimensions could be employed to act in conjunction with lens 13, or even alone (although this requires a larger movable component) for focussing purposes.

FIG. 3 is somewhat similar to FIG. 1, but here the mirror array 4 is replaced by a 2000 by 2000 micro-electromechanical array 15 of mirrors which can be tilted in at least 7 different directions, one direction producing light 7 lost to the system, leaving at least 6 useful directions. In this case the light incident on the mirror array is arranged to be reasonably well collimated, so that light reflected from mirrors of the array set to one of the useful angles is transmitted by the splitter 3 to fall on a corresponding restricted area of a collimating lens 6 and thence to a corresponding one of a 6 by 6 array 16 of lenses illuminating a corresponding local area of plane 11.

In use a sub-image signal is fed to array 15 and its location on the plane 11 is selected in at least a first dimension by selection of the deflection angle of the selected mirrors of array 15. For any sub-image, this deflection angle is selected from the six useful angles, and is common to all selected mirrors for that sub-image. If the mirrors of the array 15 are capable of multi-angle deflection about two axes (six useful direction for each axis), this alone enables selection of the sub-image location in both dimensions, and again the complete image is synthesised by tiling of the sub-images on plane 11.

Alternatively some other manner of providing selecting of the sub-area location in the second dimension must be provided—for example, the position of the photosensitive surface in plane 11 could be changed, the entire mirror array 15 could be rotated about the second axis, or a further steerable deflecting mirror could be located between splitter 3 and lens 6. It will be noted that as illustrated FIG. 3 does away with the need for the shutter array of FIG. 1.

The arrangement of FIG. 4 avoids the requirement for the lens array 16 of FIG. 3 by the use of a kaleidoscope 17 between the splitter 3 and the mirror array 15. Sub-image light emerging from splitter 3 after reflection at array 15 falls onto a local area of a lens 18 in dependence On the deflection angle of the micro-mirrors, and the lens 18 focuses it onto a corresponding local area of plane 11 so that tiling of sub-images in at least one direction may be accomplished. Arrangements for tiling in the second dimension are much the same as those discussed with reference to FIG. 3.

It should be clear to the skilled reader that these embodiments are exemplary only, and that various modification may be made within the scope of the invention defined by the appended claims. For example, although FIGS. 1 and 2 have been described with respect to a two-dimensional placement of each sub-image in plane 11 by control of the shutter array 10, 11 or the two-axis mirror 13, it should be clear that placement in one dimension may be so provided (i.e. a linear shutter array, or a one axis mirror) together with an alternative method of controlling placement in the other dimension. As discussed with respect to FIGS. 3 and 4, this could be provided, for example, by movement of the photosensitive surface, provision of a further one-axis tiltable mirror (so that in FIG. 2 there will be two such mirrors in series), or by tilting of the array 4.

What is claimed is:

1. Apparatus for exposing a photosensitive area in an image plane which area is notionally subdivided in both dimensions to form contiguous sub-areas, the apparatus comprising variable illumination means for producing a selected pixellated light pattern, directing means for directing said pattern to fill a selected one of said sub-areas, and control means responsive to an input signal representative of an image conjointly to control said illumination means and said directing means such that the entire image is produced over all of the said sub-areas, wherein said directing means comprises means for replicating said light pattern to form an array of like patterns, and selecting means for selecting one of said patterns for transmission to a corresponding sub-area of said area.

2. Apparatus according to claim 1 wherein said selecting means comprises an array of light shutters.

3. Apparatus according to claim 2 wherein each shutter corresponds to a respective one of said sub-areas.

4. Apparatus according to claim 1 wherein said replicating means comprises a lens array, each lens of said array corresponding to a respective one of said sub-areas.

5. Apparatus according to claim 1 wherein the illumination means is provided by a pixellated light source.

6. Apparatus according to claim 1 wherein the illumination means comprises a light source and a pixellated spatial light modulator.

7. Apparatus according to claim 6 wherein the spatial light modulator is a micro-electromechanical device or a liquid crystal array.

8. Apparatus according to claim 7 wherein the micro-electromechanical device comprises a two-dimensional array of tiltable mirrors.

9. Apparatus according to claim 1 wherein the illumination means is optically addressable to produce said light pattern.

10. Apparatus according to claim 1 wherein the illumination means is electrically addressable to produce said light pattern.

11. Apparatus according to claim 1 wherein the illumination means and the directing means are separate elements.

12. Apparatus according to claim 1 wherein said pixels are at least 40 microns across at said sub-area.

13. Apparatus according to claim 1 wherein said illumination means provides ultra-violet light.

14. An apparatus as claimed in claim 1 wherein the pixel size of said pattern is at least 15 μm across at the sub-area.

15. Apparatus for exposing a photosensitive area in an image plane which area is notionally subdivided in first and second dimensions to form contiguous sub-areas, the apparatus comprising variable illumination means both for producing a selected pixellated light pattern and for directing said pattern in a direction corresponding to a selected one of said sub-areas in said image plane, the variable illumination means comprising in part a micro-electrochemical device in the form of a two dimensional array to tiltable mirrors, and control means responsive to an input signal representative of an image to control said illumination means such that respective said pixellated light patterns are provided in each of the sub-areas in a sequence to synthesise the entire image, wherein the illumination means comprises an array of selectively operable elements, each element being individually capable of directing incident light towards the image plane at any selected one of a plurality of angles in at least the first said dimension so to form a said pixellated light pattern, said selected angle determining at least in part the selected sub-area.

16. Apparatus according to claim 15 wherein each mirror of the array of mirrors is tiltable about two axes to thereby determine the location of the sub-area in both said first and second dimensions.

17. Apparatus according to claim 15 wherein each mirror of the array of mirrors is tiltable about one axis to determine the location of the sub-area in the first said dimension, and light from the array of mirrors is directed to the image plane via a mirror tiltable about a different axis to determine the location of the sub-area in said second dimension.

18. Apparatus according to claim 15 wherein each mirror of the array of mirrors is tiltable about one axis to determine the location of the sub-area in the first said dimension, and means are provided for moving the photosensitive area in the image plane to determine the location of the sub-area in the said second dimension.

19. Apparatus according to claim 15 wherein light from said array of mirrors is directed to said image plane via collimating optics and a like array of lenses each corresponding to one of said plurality of angles.

20. Apparatus according to claim 15 wherein light from said array of mirrors is directed to said image plane via a kaleidoscope and a focusing lens.

21. Apparatus according to claim 15 wherein said pixels are at least 40 microns across at said sub-area.

22. Apparatus according to claim 15 wherein said illumination means provides ultra-violet light.

23. An apparatus as claimed in claim 15 wherein the pixel size of said pattern is at least 15 μm across at the sub-area.

24. A method of exposing a photosensitive area, in response to an input signal representative of an image, said area being notionally subdivided in both dimensions to form contiguous sub-regions, comprising the steps of providing a pixellated light pattern corresponding to a selected part of said image and directing said pattern to fill a corresponding selected one of said sub-regions and repeating the process for other sub-regions until the entire image is produced over all of the sub-regions of said area, said method including the steps of replicating said light pattern to form an array of like patterns, and selecting one of said patterns for transmission to a corresponding sub-area of said area.

25. A method according to claim 24 wherein said photosensitive area comprises a recording medium.

26. A method according to claim 24 wherein said recording material is selectively cured, or selective rendered removable, on exposure to light from said illumination means.

27. A method according to claim 24 wherein said light from the illumination means comprises ultra-violet light.

28. A method of producing a printing plate including the step of performing the method of claim 24.

29. An apparatus as claimed in claim 24 wherein the pixel size of said pattern is at least 15 μm across at said photosensitive area.

30. A method of exposing a photosensitive area, in response to an input signal representative of an image, said area being notionally subdivided in both dimensions to form contiguous sub-regions, comprising the steps of providing a pixellated light pattern corresponding to a selected part of said image and directing said pattern to fill a corresponding selected one of said sub-regions and repeating the process for other sub-regions until the entire image is produced over all of the sub-regions of said area, said method including the steps of controlling individual elements of a light modulator array both to produce said pixellated pattern with light and to direct light towards the image plane at any selected one of a plurality of angles thereby to determine at least in part the selected sub-area, the light modulator comprising in part a micro-electromechanical device in the form of a two dimensional array to tiltable mirors.

31. An apparatus as claimed in claim 30 wherein the pixel size of said pattern is at least 15 μm across at said photosensitive area.

* * * * *